(12) United States Patent
Sundar

(10) Patent No.: US 6,856,863 B1
(45) Date of Patent: Feb. 15, 2005

(54) METHOD AND APPARATUS FOR AUTOMATIC CALIBRATION OF ROBOTS

(75) Inventor: Satish Sundar, Milpitas, CA (US)

(73) Assignee: Applied Materials, Inc., Santa Clara, CA (US)

( * ) Notice: Subject to any disclaimer, the term of this patent is extended or adjusted under 35 U.S.C. 154(b) by 402 days.

(21) Appl. No.: 09/626,362

(22) Filed: Jul. 27, 2000

(51) Int. Cl.$^7$ .............................................. G05B 19/18
(52) U.S. Cl. ..................... 700/254; 700/255; 700/258; 700/218; 318/568.13; 318/568.11; 318/568.1; 901/46
(58) Field of Search ................................ 700/258, 218, 700/214, 245, 251–255; 901/46, 1; 318/568.1, 568.11–568.13; 414/331.14, 331.18, 937, 939

(56) References Cited

U.S. PATENT DOCUMENTS

| | | | |
|---|---|---|---|
| 4,685,862 A | | 8/1987 | Nagai et al. ............ 414/744 A |
| 5,177,563 A | | 1/1993 | Everett et al. ............... 356/375 |
| 5,535,306 A | | 7/1996 | Stevens ........................ 395/89 |
| 5,655,060 A | | 8/1997 | Lucas ............................ 395/85 |
| 5,783,834 A | | 7/1998 | Shatas ..................... 250/559.33 |
| 5,876,325 A | * | 3/1999 | Mizuno et al. .............. 600/102 |
| 6,128,585 A | * | 10/2000 | Greer .......................... 702/104 |
| 6,224,312 B1 | | 5/2001 | Sundar ........................ 414/217 |

OTHER PUBLICATIONS

Sundar, Satish. "Improved Throughout Using Time–Optimal Motion Planning and Design," Automation/Simulation & Modeling/Software, Mar. 15, 1996, 6 pages.

* cited by examiner

*Primary Examiner*—Donald P. Walsh
*Assistant Examiner*—Jeffrey A. Shapiro
(74) *Attorney, Agent, or Firm*—Moser, Patterson & Sheridan

(57) ABSTRACT

An automatic calibration method and apparatus for robots, particularly robots used in substrate processing systems. The method for calibrating a robot in a processing chamber comprises: determining a useable free-space for the robot in a processing system; determining a distance between a position of a robot end effector and a target position in the useable free-space; and generating a path within the useable space from the position of the robot end effector to the target position using incremental displacements of the robot end effector that minimize the distance between the robot end effector and the target position. The apparatus for calibrating a robot in a processing system comprises: a sensor disposed at a location to be taught; a receiver disposed on a robot end effector; and a microprocessor connected to receive signals from the sensor and the receiver to determine a distance between the sensor and the receiver, wherein the microprocessor generates a path using incremental movements that minimizes the distance between the sensor and the receiver.

12 Claims, 3 Drawing Sheets

METHOD AND APPARATUS FOR AUTOMATIC CALIBRATION OF ROBOTS

BACKGROUND OF THE INVENTION

1. Field of the Invention

The present invention generally relates to calibration of a robot. More particularly, the invention relates to automatic calibration of a robot in a processing system.

2. Background of the Related Art

The use of robots is convenient wherever and whenever the operations to be executed are high-precision, repetitive, tedious, stressful or otherwise hazardous to humans. Industries such as automobile manufacturing, production and assembly of integrated circuits, material handling and many others have employed industrial robots to improve efficiency and increase productivity.

Many robots share the same basic design incorporating a base with one or more movable arms attached to the base. The arm typically includes a number of rigid bodies or segments connected by joints with a tool or an end effector usually mounted on the last segment. While the base is stationary, the joints are free to move in "revolute" or "prismatic" fashion. Revolute joints are hinged to provide motion along an arc while prismatic joints are telescopic or extendible to provide linear motion. The end effector is typically provided with a mounted gripper or some other device useful for manipulating objects. For example, end effectors for handling semiconductor wafers or other objects with flat and smooth surfaces are equipped with a robot blade, a vacuum chuck or other means for holding and supporting the wafer or object to be transported. After securing the object with the end effector, the robot can move or change the position of the object. When the robot is automated or computer-programmed, it can perform these tasks repeatedly. This is advantageous, but requires a few preparatory steps. In particular, the robot has first to be "shown" or "taught" what to do. The process of showing or teaching the robot is generally called calibration.

In the manufacture of integrated circuits, semiconductor substrates are loaded into various reaction and other chambers using automated equipment for processing. Equipment has been designed including a robot that can transfer a semiconductor substrate, such as a silicon wafer, from a cassette through a central transfer chamber and into one or more processing chambers connected to the transfer chamber. The robot is disposed within the transfer chamber and provides access to the process chambers connected to the transfer chamber. It is desirable to position the substrate at an optimum location within the processing chamber to maximize the effectiveness of the processing onto the precise desired surface area of the substrate to be processed.

According to one simple teaching method, the robot is taken through its operational path, from the point where the end effector grasps the object or workpiece to the point where it releases it. At certain points in its operation path, the robot is stopped and the joint values are recorded. Many conventional robots have internal systems that automatically report joint values. These joint values can be fed to the robot memory for later reference. When the time comes for the robot to do its job, it "remembers" the joint values that correspond to the desired position and performs its task accordingly.

Currently, robots used in substrate processing systems are typically calibrated using a manual calibration method. The robot is instructed to move according to inputs from a human operator into the robot movement control system. The human operator visually observes the position of the robot within the processing system and plans the path of the robot to avoid obstructions in the processing system. The human operator then manually inputs signals that instruct the robot to move from an initial position to a destination position. To determine that the robot has reached its destination position, an alignment pin is inserted through a calibration hole on the end effector to a corresponding calibration hole at the destination position. The destination position is reached when the alignment pin aligns the matching calibration holes. The movement of the robot from the initial position to the destination position is recorded so that it can be repeated when the same action is required.

However, there are several disadvantages to the manual calibration method. First, manual calibration relies on the ability of a human operator to properly align elements and introduces the possibility of human error. Also, the manual calibration method also requires a considerable amount of time when many locations are to be trained. Furthermore, the speed and accuracy of the manual calibration method mainly depends on the ability of the human operator to perform the calibration. Thus, the manual calibration method has not been satisfactory for the high-precision robot training, particularly for robots used for substrate processing systems.

Therefore, there is a need for an apparatus and a method for automatic calibration of robots, particularly robots used in substrate processing systems. It is desirable for the automatic calibration apparatus and method to achieve fast and accurate calibration while reducing dependence on the ability of human operators. It is further desirable for the automatic calibration apparatus and method to provide reliable calibration and be adaptable for use with a variety of robots.

SUMMARY OF THE INVENTION

The present invention generally provides an apparatus and a method for automatic calibration of robots, particularly robots used in substrate processing systems. The automatic calibration apparatus and method according to the present invention provide fast, accurate and reliable calibrations while reducing or eliminating dependence on the ability of human operators. The automatic calibration apparatus and method are also adaptable for use with a variety of robots.

The method for calibrating a robot in a processing chamber according to the invention comprises: determining a useable free-space for the robot in a processing system; determining a distance between a position of a robot end effector and a target position in the useable free-space; and generating a path within the useable space from the position of the robot end effector to the target position using incremental displacements of the robot end effector that minimize the distance between the robot end effector and the target position. Preferably, the incremental displacements of the robot end effector is computed using a constrained gradient optimization process that calculates a path within the useable free space and avoids all obstacles and physical constraints within the system.

The apparatus for calibrating a robot in a processing system according to the invention comprises: a sensor disposed at a location to be taught; a receiver disposed on a robot end effector; and a microprocessor connected to receive signals from the sensor and the receiver to determine a distance between the sensor and the receiver, wherein the microprocessor generates a path using incremental movements that minimizes the distance between the sensor and the receiver. Preferably, the sensor is disposed in a target calibration hole at the location to be taught and the receiver is disposed in a robot end effector calibration hole.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
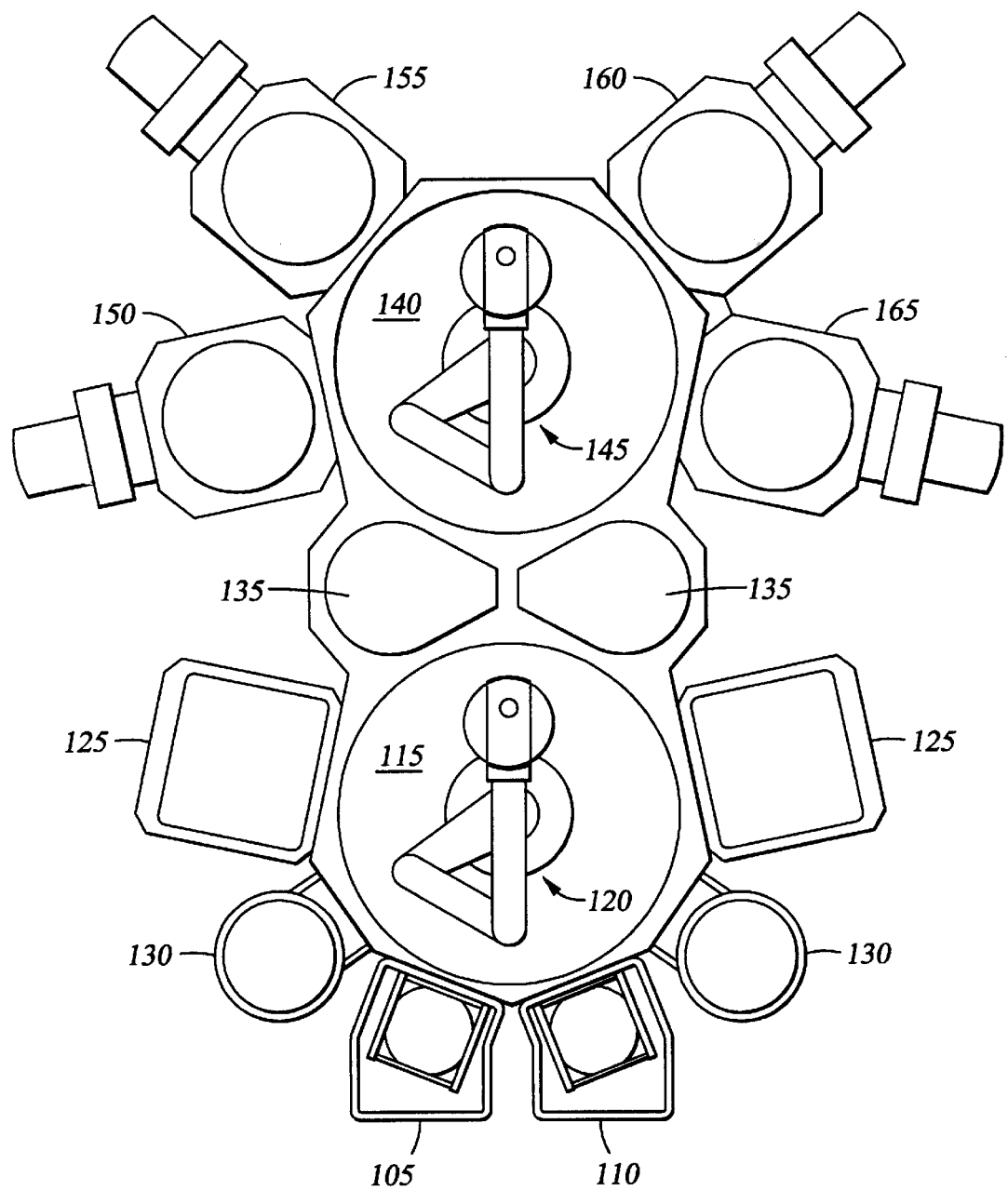
FIG. 1 is a schematic view of a staged vacuum processing system having multiple substrate processing chambers.

The invention generally provides an apparatus and a method for automatic calibration of robots useful in processing systems. FIG. 1 is a schematic view of a staged vacuum processing system having multiple substrate processing chambers. Examples of staged vacuum processing systems include the Centura™, Endura™, Producer™ and P5000® systems available from Applied Materials, Inc., Santa Clara, Calif. Although the invention is described with respect to a robot in a transfer chamber of the staged vacuum processing system, it is understood that the invention is useful for other robot applications in various processing systems.

The staged vacuum processing system 100 includes vacuum load-lock chambers 105 and 110 attached to a first stage transfer chamber 115. The load-lock chambers 105 and 110 maintain vacuum conditions within the first stage transfer chamber 115 while substrates enter and exit system 100. A first robot 120 transfers substrates between the load-lock chambers 105 and 110 and one or more substrate processing chambers 125 and 130 attached to the first stage transfer chamber 115. Processing chambers 125 and 130 can be outfitted to perform a number of substrate processing operations such as chemical vapor deposition (CVD), physical vapor deposition (PVD), etch, pre-clean, degas, orientation and other substrate processes. The first robot 120 also transfers substrates to/from one or more transfer chambers 135 disposed between the first stage transfer chamber 115 and a second stage transfer chamber 140.

The transfer chambers 135 are used to maintain ultrahigh vacuum conditions in the second stage transfer chamber 140 while allowing substrates to be transferred between the first stage transfer chamber 115 and the second stage transfer chamber 140. A second robot 145 transfers substrates between the transfer chambers 135 and a plurality of substrate processing chambers 150, 155, 160 and 165. Similar to processing chambers 125 and 130, the processing chambers 150 to 165 can be outfitted to perform a variety of substrate processing operations. For example, the processing chamber 150 is a CVD chamber; the processing chamber 155 is an etching chamber; and the processing chambers 160, 165 are PVD chambers. The above listed sequence arrangement of the processing chambers is useful for forming integrated circuits on semiconductor substrates. A plurality of vacuum systems may be utilized to perform all of the processes required to complete manufacturing of an integrated circuit or chip.

During operation, substrates are typically stored in a cassette and loaded into the vacuum load-lock chambers 105 and 110 by a conveyor belt or robot system (not shown) that operates under the control of a computer program executed by a microprocessor or computer (not shown). The computer preferably also controls the operation of the robots 120 and 145, including operations such as substrate transfers between various processing chambers of the cluster tool system 100. The present invention provides a method for calibrating the robots to perform the tasks required throughout substrate processing.

Figure 2:
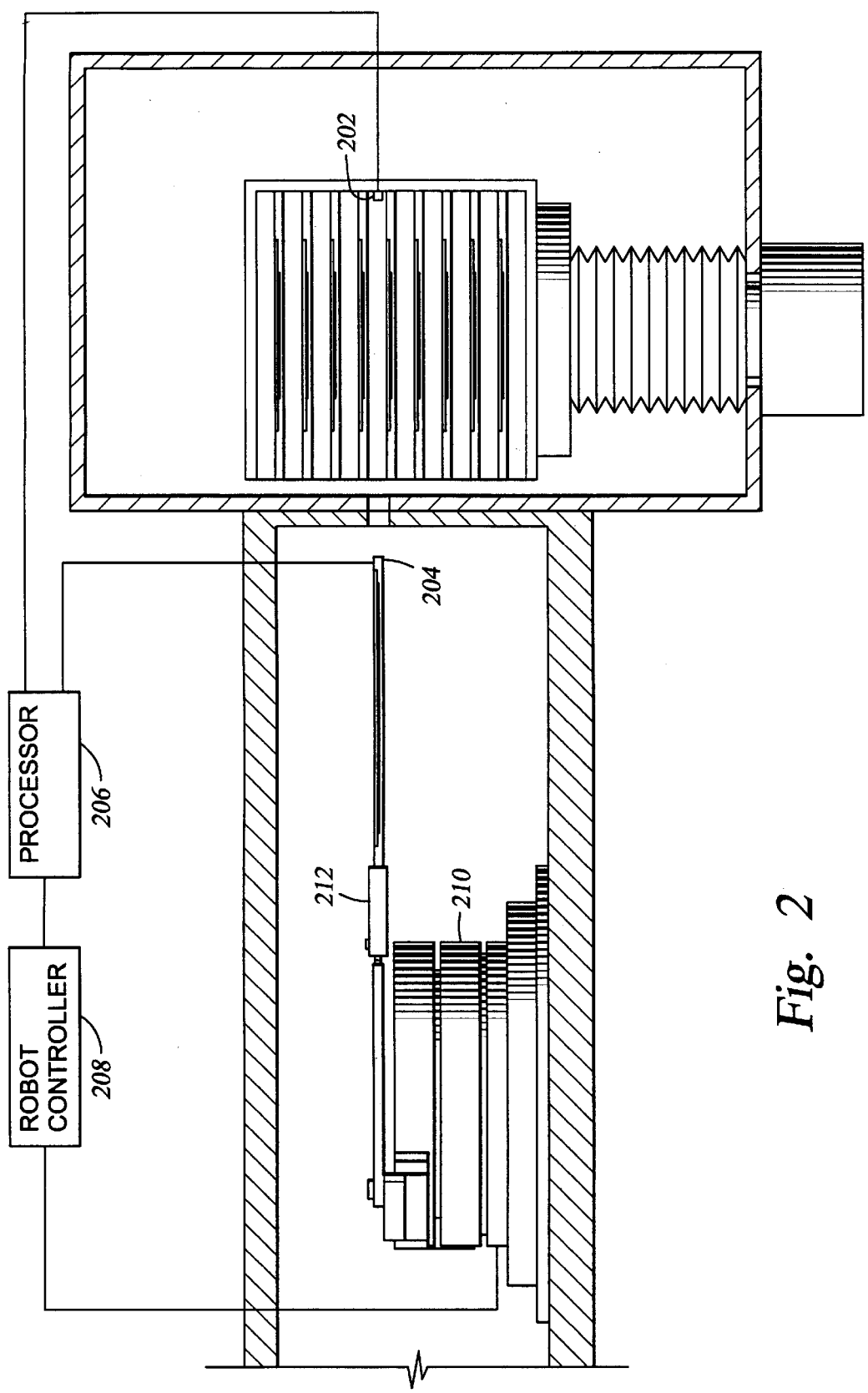
FIG. 2 is a schematic diagram of the auto-calibration apparatus according to the invention.

FIG. 2 is a schematic diagram of the auto-calibration apparatus according to the invention. Generally, the auto-calibration apparatus 200 includes an emitter 202, a receiver 204 and a processor 206. The emitter 202 and the receiver 204 are connected to the processor 206 and provide signals to the processor 206. Preferably, the emitter 202 is mounted in a calibration hole at a target location to be taught, and the receiver 204 is mounted in a calibration hole on the robot end effector. The emitter 202 and the receiver 204 together serve as an analog proximity sensor that provides the actual positions of the emitter and the receiver and an output representing a measurement of the distance and the direction between the emitter 202 and the receiver 204. The locations of the emitter 202 and receiver 204 can be interchanged as long as the homing program is correspondingly changed to home-in toward the device disposed at the destination location. An example of an analog proximity sensor is an inductive proximity sensor from Precision Navigation, Inc., Santa Rosa, Calif. Alternatively, a laser-based proximity sensor can be used to determine the distance between the target position and the robot position. As another alternative, a compass is used to supply the direction from the robot toward the target position, and a distance approximation is used to home in toward the target position. In this alternative, two sets of sensors, a directional sensor and a distance approximation sensor, are required to provide the information needed to determine the calibration path according to the invention.

The processor 206 processes the signals from the emitter 202 and the receiver 204 and determines the distance between the emitter 202 and the receiver 204 and the direction from the receiver 204 to the emitter 202. The processor 206 also perform other processing and control functions, such as processing robot path planning algorithms and generating signals to a robot controller that control the actual movement of the robot. The processor 206 is typically connected to the robot controller 208 through communication lines, such as computer communication cables. The robot controller 208 is preferably electrically connected to the robot motors to provide motor control signals to control the movement of the robot.

Typically, the robot used in semiconductor substrate processing systems is a SCARA robot or a frog-leg type of robot having a multiple degree of freedom. Generally, the movement of the robot is defined by the robot kinematic equation which is represented by the following equation:

$$x = f(\theta) \qquad \text{Equation (1)}$$

where x represent the vector from the center of the robot base to the tip of the end effector or the point of interest related to the end effector (i.e., location of the receiver) and θ represents the joint vector of the robot. The vector function f(θ) represents the kinematic equation of the robot which defines the movement and position of robot. The robot movement can be two-dimensional (i.e., x-y plane) or three-dimensional (i.e., x-y-z space), and the vectors represents the corresponding two or three dimensional movements.

The small displacement of the tip or point of interest related to the end effector (i.e., δx) is related to the small displacement of the robot joints (i.e., δθ) as defined by the following equation:

$$\delta x = R(\theta) \delta \theta \qquad \text{Equation (2)}$$

where R(θ) represents the jacobian matrix of the robot.

A robot disposed in a processing system, such as the processing system illustrated in FIG. 1, typically has robot movements that are constrained by the various chambers of the processing system. When the robot transfers an object from one position to another in the processing system, the robot itself and the object that is being handled by the robot must not physically contact other components of the processing system to avoid damage to the object, the robot and other components of the processing system. Typically, the constraints on the robot movement are derived from the geometry of the processing system and the kinematics of the robot. For example, the robot movement is constrained by the walls of the transfer chamber and the slit valves between the transfer chamber and the attached processing or loadlock chambers. The set of positions which the robot movement is unconstrained is typically called the free space (G). The exact free space (G) of the processing system can be calculated using various methods well known in the art.

According to the invention, the robot is calibrated using an auto-calibration algorithm that utilizes outputs from an analog proximity sensor. More specifically, the auto-calibration algorithm utilizes the analog outputs of the emitter 202 and receiver 204 to measure actual distance and direction between a point on the robot end effector and a target point to plan a path within the free space (G) that minimizes the distance function between the emitter and the receiver.

The auto-calibration algorithm provides the solution, computed as the robot is moving, to the following optimization problem:

$$\min \|x_{target} - x_{robot}\|^2 \qquad \text{Equation 3}$$

subject to the following constraints:

$$x \in G \qquad \text{Equation 4}$$

where G represents the free space of the processing system. Alternatively, the auto-calibration algorithm computes a solution to the following optimization problem:

$$\min \|x_{target} - x_{robot}\| \qquad \text{Equation 5}$$

instead of Equation 3 above. In this case, the algorithm is modified to accommodate that equation 5 is not differentiable when the target position equals the robot position (i.e., $x_{target} - x_{robot} = 0$). As the robot position approaches the target position, an approximation or estimation is calculated to determine whether the target position has been reached.

The optimization problem is preferably solved using constrained gradient search methods, which are well known in the art. These methods generally use gradient information of the cost function to compute incremental displacements, δx, to reduce the cost, i.e., the value of the function $\|x_{target} - x_{robot}\|^2$.

The incremental displacements of the robot motors, δθ, corresponding to the incremental displacement, δx, is computed using Equation (2). The incremental displacements (δθ) are recorded in memory of the processor as the robot is calibrated. The algorithm converges, without fail, to the target position, $x_{target}$, because the cost function has a unique minimum at the target position.

The auto-calibration is performed for each task to be performed by the robot in the system, and the results of each calibration is recorded in memory of the processor. After the robot has been calibrated for the tasks required for the system, the robot is capable of performing each of the calibrated task, as needed, by recalling the recorded steps from memory and executing the recorded steps.

An alternative embodiment of the invention provides a defined free space (G*), instead of a calculated actual free space (G), within the processing system. According to this embodiment, the free space of the processing system is defined using simple geometric shapes that fit within the actual free space of the processing system (i.e., the defined free space G* is a subset of the complete free space G). The simple geometric shapes typically include circles, ellipses, rectangles, polygons, and other geometric shapes defined by equations. For example, the defined free space G* of the transfer chamber and a load lock chamber is defined as the union of a circle and a rectangle, wherein the circle represents a simplified free space of the transfer chamber and the rectangle represents a simplified free space extending from the transfer chamber into the load lock chamber. By defining the free space G* of the processing system as combinations of simple geometric forms instead of the calculated complete free space, the optimization process of the auto-calibration algorithm is simplified because the step of calculating the actual free space of the processing system is no longer necessary. Because the defined free space G* is defined as combinations of simple geometric forms (i.e., circles, ellipses, rectangles, polygons and other geometric shapes defined by equations), the optimization program has simpler calculations when utilizing projected gradient methods, which compute the direction of the greatest reduction in cost (i.e., distance) by finding the projection of the negative gradient of the cost (i.e., distance) function within the defined free space G*. The optimization program then generates a path corresponding to incremental displacements of the robot within the defined free space G* of the processing system. The auto-calibration is performed for each task to be performed by the robot in the system, and the results of each calibration is recorded in memory of the processor. After the robot has been calibrated for the tasks required for the system, the robot is capable of performing each of the calibrated task, as needed, by recalling the recorded steps from memory and executing the recorded steps.

EXAMPLE

Figure 3:
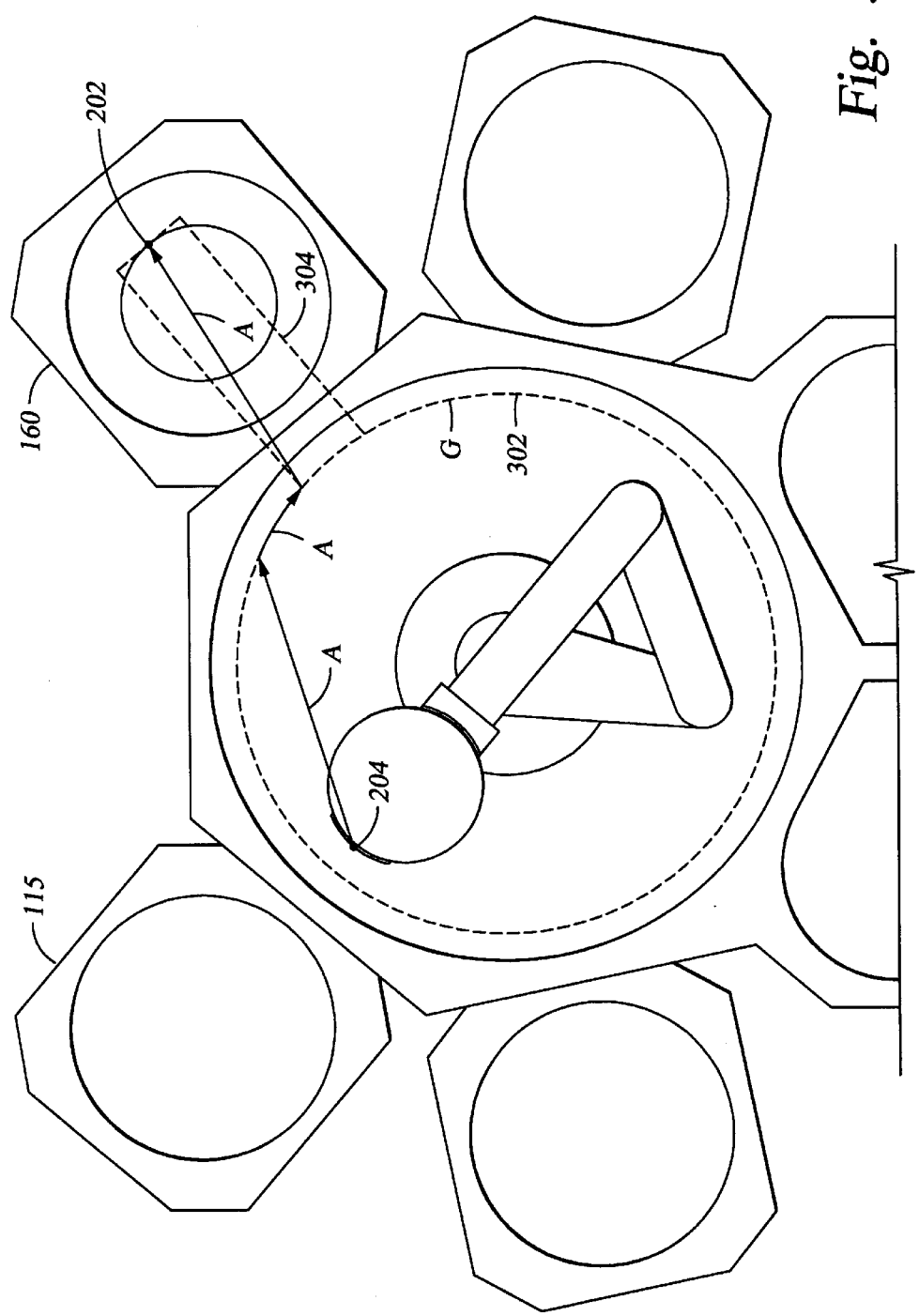
FIG. 3 is a schematic view of a central transfer chamber having a plurality of processing chamber attached thereto.

FIG. 3 is a schematic view of a central transfer chamber having a plurality of processing chamber attached thereto. The example describes a calibration of the robot from an initial rest position in a transfer chamber to a target position inside of a processing chamber 160. The auto-calibration of the robot is initiated by a measurement of the distance between the emitter 202 and the receiver 204 and their respective positions. The processor 206 receives the signals from the emitter 202 and the receiver 204 and processes the information using the auto-calibration algorithm. To simplify the optimization process of the auto-calibration algorithm, the free space of the processing system is defined by the operator as combinations of simple geometric forms instead of the calculated complete free space. As shown in FIG. 3, the user-defined free space G* of the transfer chamber and the load lock chamber is defined as the union of a circle 302 and a rectangle 304. By defining the free space G* in simple geometric forms (i.e., circles, ellipses, rectangles, polygons and other geometric shapes defined by equations) the optimization program has simpler calculations and can utilize projected gradient methods, which compute the direction of the greatest reduction in distance by finding the projection of the negative gradient of the distance function within the free space G*. The processor generates a set of incremental robot movements that minimizes the distance function between the emitter and the receiver. The arrows A indicate the path generated by the optimization program during auto-calibration and correspond to incremental displacements of the robot within the defined free space G* of the processing system. The steps generated by the auto-calibration method are recorded in memory of the processor and recalled from memory as needed for a specific robot task.

Advantages

The present invention provides an auto-calibration method that is generally applicable to any robot given the kinematic equations that define the robot movements. Because the present invention can be implemented in hardware, there is no need to design or program extensive code (software) for each specific robot to perform a variety of auto-calibration sequences. Furthermore, the present invention utilizes extensively tested optimization codes currently available and is adaptable for use with current as well as future optimization algorithms. The auto-calibration method according to the invention provides a unique minimum solution to the cost (distance) function for all feasible initial points and also indicates whether an initial point is feasible. The present invention provides a robust and reliable method for auto-calibration using optimization programs that guarantees convergence to the target point.

While the foregoing is directed to the preferred embodiment of the present invention, other and further embodiments of the invention may be devised without departing from the basis scope thereof, and the scope thereof is determined by the claims that follow.

What is claimed:

1. A method for calibrating a robot in a processing chamber, comprising:
    a) determining a useable free-space in the processing chamber;
    b) positioning an emitter at a target point;
    c) positioning a receiver at a point on an end effector of the robot;
    d) determining a distance between the point on the end effector of the robot and the target point using signals from the emitter and the receiver; and
    e) determining a path from the point on the end effector of the robot and the target point using a path planning algorithm that minimizes a distance function between the point on the end effector of the robot and the target point within the useable free space.

2. The method of claim 1 wherein the path is determined using incremental displacements of the robot end effector that minimize the distance between the robot end effector and the target position.

3. The method of claim 1 wherein the useable free-space is calculated as an actual free-space for the robot in the processing system.

4. The method of claim 1 wherein the useable free-space is defined as a subset of an actual free-space for the robot in the processing system.

5. An apparatus for calibrating a robot in a processing system, comprising:
    a) a sensor disposed at a location to be taught;
    b) a receiver disposed on a robot end effector; and
    c) a microprocessor connected to receive signals from the sensor and the receiver to determine a distance between the sensor and the receiver, wherein the microprocessor generates a path using incremental movements that minimizes the distance between the sensor and the receiver.

6. The apparatus of claim 5 wherein the sensor is disposed in a target calibration hole at the location to be taught and the receiver is disposed in a robot end effector calibration hole.

7. The method of claim 1, wherein the useable free-space is calculated as an actual free-space for the robot in the processing system.

8. The method of claim 1, wherein the useable free-space is defined as a subset of an actual free-space for the robot in the processing system.

9. The method of claim 8, wherein the distance between a position of a robot end effector and the target position is determined using an analog proximity sensor.

10. The method of claim 5, the path generated is within an useable free-space of the processing system.

11. The method of claim 10, wherein the useable free-space is calculated as an actual free-space for the robot in the processing system.

12. The method of claim 10, wherein the useable free-space is defined as a subset of an actual free-space for the robot in the processing system.

* * * * *